United States Patent [19]

Boulin

[11] 4,386,459
[45] Jun. 7, 1983

[54] ELECTRICAL MEASUREMENT OF LEVEL-TO-LEVEL MISALIGNMENT IN INTEGRATED CIRCUITS

[75] Inventor: David M. Boulin, Franklin Township, Warren County, N.J.

[73] Assignee: Bell Telephone Laboratories, Incorporated, Murray Hill, N.J.

[21] Appl. No.: 167,408

[22] Filed: Jul. 11, 1980

[51] Int. Cl.³ .............................................. H01L 21/66
[52] U.S. Cl. ........................................ 29/574; 29/578; 324/158 R
[58] Field of Search .............. 29/574, 578; 324/158 R

[56] References Cited

U.S. PATENT DOCUMENTS

| | | | |
|---|---|---|---|
| 3,650,020 | 3/1972 | Mar ...................................... | 29/574 |
| 3,808,527 | 4/1974 | Thomas ............................. | 29/574 X |
| 3,835,530 | 9/1974 | Kilby ..................................... | 29/574 |
| 3,983,479 | 9/1976 | Lee et al. ......................... | 324/158 R |
| 4,144,493 | 3/1979 | Lee et al. ............................ | 29/574 X |
| 4,257,825 | 3/1981 | Schaumberg ......................... | 148/1.5 |

FOREIGN PATENT DOCUMENTS 54-34787  3/1979  Japan .................................... 29/574

OTHER PUBLICATIONS

Russell et al., *Internat. Electron Devices Meeting Techn. Dig.*, Dec. 5-7, 1977, Wa. D. C., Sect. 2.1, pp. 7A-7F.

*Primary Examiner*—G. Ozaki
*Attorney, Agent, or Firm*—Lucian C. Canepa

[57] ABSTRACT

At least one chip on a multiple-chip integrated circuit wafer is dedicated for use as a test device for checking mask level-to-level misalignment. The test device is made during the same fabrication sequence in which the circuit-containing chips are made. No additional processing steps are required for the test device. By forming unique S-shaped members in each test device and establishing electrical contact therewith, a sensitive electrical tester is provided for indicating level-to-level registration in the circuit-containing chips.

4 Claims, 3 Drawing Figures

ELECTRICAL MEASUREMENT OF LEVEL-TO-LEVEL MISALIGNMENT IN INTEGRATED CIRCUITS

BACKGROUND OF THE INVENTION

This invention relates to a fabrication sequence utilizing a test structure for monitoring level-to-level misalignment of integrated circuits and, more particularly, to a test device for electrically measuring misalignment between mask levels during manufacture of an integrated circuit wafer.

As integrated circuits become increasingly complex and small in size, it is becoming more important to be able to accurately measure the misalignment between successive features defined by different mask levels during the overall fabrication sequence. An electrical test procedure for indicating misalignment between mask levels is described in "A Comparison of Electrical and Visual Alignment Test Structures for Evaluating Photomask Alignment in Integrated Circuit Manufacturing", *International Electron Devices Meeting Technical Digest*, Dec. 5-7, 1977, Washington, D.C., section 2.1, pages 7A-7F.

FIG. 1 of the aforecited article shows a so-called electrical alignment resistor pair. The resistor pair is implemented in a wafer during the normal fabrication sequence in which multiple circuits are being formed in the wafer at respective chip sites. Each resistor pair comprises two orthogonally disposed straight legs formed in a given level of a multi-layered structure. The legs are parallel to reference x and y directions, respectively, and are connected together. Connections are made to spaced-apart points of each leg via contact windows formed in an overlying insulating layer. A patterned conductive layer on top of the insulating layer includes conductive portions in the windows and serves to connect the spaced-apart points to respective contact pads. During testing, current is caused to flow through each two-legged resistor. In turn, the voltages appearing across two prescribed portions of each leg are measured. An electrical indication of misalignment of the contact windows in both the x and y directions can thereby be provided. Thus, for example, for an x-direction misalignment of $\Delta x$, the voltage appearing across one portion of the x-parallel leg would ideally increase by $\Delta V$ relative to the perfectly aligned case and the voltage appearing across the other portion thereof would ideally decrease by $\Delta V$. Similar indications would be provided in the y-parallel leg for y-direction window misalignment.

In practice, absolutely perfect alignment is an ideal that is never achieved. The limitations of the various standard processes and equipment employed to fabricate an actual integrated circuit device mean that even when level-to-level alignment is as good as can be practically realized, tolerably small misalignment will exist. As a result, even when level-to-level alignment is achieved within prescribed limits, the test voltages respectively appearing across the two portions of an x-parallel or a y-parallel leg will typically not be exactly equal. This normal or quiescent difference in the values of the measured voltages constitutes in effect a noise signal.

To be able to reliably detect a given misalignment, it is desired that the voltage difference between the two portions of an x leg or a y leg in a test structure of the type described above be as large as possible. Thus, efforts have been directed by workers in the field at trying to increase the voltage difference that occurs in a test structure in response to a given level-to-level misalignment. It was realized that such an improved capability, if available, would increase the sensitivity of the aforedescribed testing technique for measuring misalignment in an integrated circuit fabrication process. In turn, reliable monitoring of small level-to-level misalignments provides a basis for modifying the fabrication process to achieve higher-yield and lower-cost integrated circuit devices.

SUMMARY OF THE INVENTION

Hence, an object of the present invention is an improved test device and an improved fabrication process utilizing such a device. More specifically, an object of this invention is an improved test structure for embodiment in an integrated circuit wafer fabrication sequence. By means of the structure, the accuracy of alignment between mask levels in the wafer fabrication process can be measured with higher sensitivity than in the tester described in the aforecited article.

Briefly, these and other objects of the present invention are realized in a specific illustrative embodiment thereof in which an integrated circuit wafer comprises at least one dedicated test site. At each such site, two interconnected conductive S-shaped test members are formed during the normal integrated circuit fabrication sequence in which circuits are being made at multiple other sites. One member, which constitutes an x-direction misalignment tester, comprises three interconnected horizontal legs to which electrical contacts are designed to be made. The other test member, which constitutes a y-direction misalignment tester, is disposed at 90 degrees with respect to the x-direction tester and comprises three interconnected vertical legs to which electrical contacts are designed to be made. Contacts to each test member are made via windows established in an adjacent insulating layer. For an x-direction misalignment of $\Delta x$, the voltage appearing across one portion of the x-direction test member increases by $2\Delta V$ relative to the aligned case whereas the voltage appearing across the other portion thereof decreases by $2\Delta V$. For a y-direction misalignment, similar indications are provided by the y-direction test member.

In summary, the present invention comprises a semiconductor wafer that includes multiple chip sites wherein multiple integrated circuits are to be respectively fabricated simultaneously in accordance with a process sequence in which windows are designed to be formed in an insulating layer that is disposed between patterned upper and lower conductive layers. The wafer further includes at least one site dedicated for alignment test purposes. Each such site has formed therein at the level of the lower or upper layer two interconnected S-shaped conductive members disposed at 90 degrees with respect to each other.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

Figure 1:
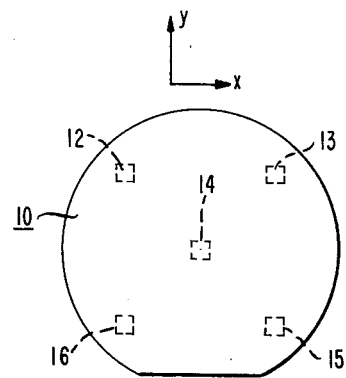
FIG. 1 shows a semiconductor wafer having plural sites at which test structures made in accordance with this invention are formed.

FIG. 1 shows a wafer 10. Multiple standard integrated circuits or devices are intended to be fabricated at multiple chip sites or locations on the wafer 10, in a manner well known in the art. In one specific illustrative case, the wafer 10 comprises a four-inch-diameter member made of a semiconductor material such as silicon and includes 256 standard circuits or devices thereon. In addition, the wafer 10 includes at least one site at which an alignment test structure made in accordance with the principles of the present invention is formed.

In practice, it is often advantageous to include plural spaced-apart test sites on the wafer 10 of FIG. 1. In that way, rotational misalignment and warpage of the overall wafer, as well as misalignment at specified site locations, can be monitored. Illustratively, five such test sites 12 through 16 distributed approximately evenly on the wafer 10 are indicated in FIG. 1. Each test site in FIG. 1 is outlined in dashed lines. (The chip sites at which standard integrated circuits or devices are fabricated are not specifically indicated in FIG. 1.) By way of example, each test site comprises a square region approximately 400 micrometers ($\mu$m) on a side. By forming a misalignment test structure at each such site, a representative indicaton is obtained of mask level-to-mask level alignment over the entire surface of the wafer during the integrated circuit fabrication process.

In the course of fabricating conventional integrated circuits, the accurate alignment of contact windows with respect to previously defined features is a particularly critical and difficult step. Accordingly, the specific illustrative test structure described herein in particular detail will be set forth in the context of monitoring window level alignment in a multi-layered integrated circuit structure.

In the particular example specified below, window alignment with respect to an underlying conductive pattern is to be checked. The windows are formed through an insulating layer overlying the conductive pattern. Subsequently, another patterned conductive layer is formed on the insulating layer and in the windows to establish electrical connections between the two conductive layers. In that particular case, S-shaped test members made in accordance with the principles of applicant's invention are formed in the lower conductive layer. But it is to be understood that in other cases wherein, for example, the alignment of an upper patterned conductive layer with respect to windows formed in an underlying insulating layer disposed on a lower patterned conductive layer is to be monitored, the S-shaped test members are formed in the upper conductive layer. In this last-mentioned case, the lower conductive layer is made, illustratively, of polysilicon and the upper conductive layer is made of a suitable metal such as aluminum. By utilizing applicant's sensitive testing technique, the alignment of the patterned upper metallic layer with respect to the windows is effectively monitored.

A test structure made in accordance with the principles of the present invention provides a sensitive indication of the occurrence of level-to-level misalignment. In response thereto, the process sequence can in practice often be adjusted to avoid an increasing misalignment trend which, if not corrected, could in time lead to faulty integrated circuit structures.

Figure 2:
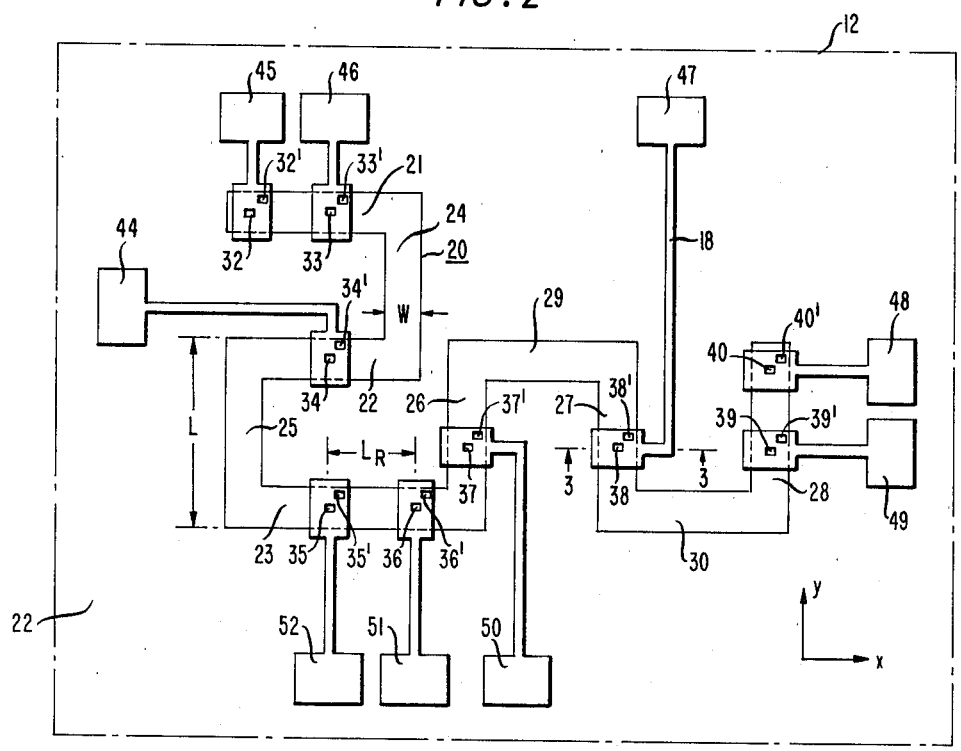
FIG. 2 is a top view of a specific illustrative test structure made in accordance with the principles of the present invention.

FIG. 2 is a top-view depiction of a specific illustrative test structure made in accordance with the principles of the present invention. The FIG. 2 depiction is a particular structure designed to monitor window level alignment in a multi-layered integrated circuit wafer. In FIG. 2, the area encompassed within dashed lines is an enlarged version of the test site 12 indicated in FIG. 1. The test structure of FIG. 2 is fabricated layer by layer at the same time that standard integrated circuits are being formed at other sites in the wafer 10. Thus, for example, each conductive member formed in a test site is made during a step in which a conductive feature is being defined in the multiple circuit sites. Similarly, insulating layers, contact windows, contact pads and interconnections are subsequently formed in parallel at test and circuit sites.

In general, the test structure of FIG. 2 comprises a multi-legged conductive member 20 formed in or on a base 22. For purposes of an initial specific example, the base 22 will be assumed to comprise the silicon substrate of the wafer 10, and the member 20 will be assumed to comprise a conventional diffused or implanted region formed within the substrate 22.

The member 20 of FIG. 1 may be regarded as comprising two interconnected S-shaped elements. One S-shaped element includes three horizontal legs 21 through 23 and two vertical legs 24, 25. The other S-shaped element includes three vertical legs 26 through 28 and two horizontal legs 29, 30. As seen in FIG. 2, the two specified S-shaped elements are oriented at 90 degrees with respect to each other. The first-mentioned S-shaped element constitutes an instrumentality by means of which x-direction misalignment can be electrically monitored, whereas the other element constitutes part of a y-direction alignment monitor.

Figure 3:
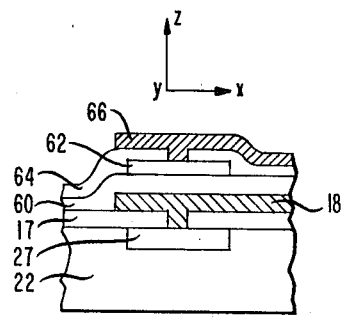
FIG. 3 is a schematic cross-sectional representation of the illustrative test structure shown in FIG. 2, as viewed along the lines designated 3 in FIG. 2.

For purposes of not unduly cluttering FIG. 2, an insulating layer that overlies the substrate 22 and the member 20 is not shown therein. This layer, which is, for example, made of silicon dioxide, is shown in FIG. 3 and designated there by reference numeral 17. Also depicted in FIG. 3 are the substrate 22 and the conductive leg 27 of the y-direction S-shaped member of FIG. 2. As indicated earlier above, FIG. 3 constitutes a cross-sectional depiction of a portion of the FIG. 2 test structure as viewed along the lines designated 3.

In accordance with the processing sequence utilized to fabricate multiple conventional integrated circuits on the wafer 10 of FIG. 1, precisely aligned microminiature holes or windows are designed to be formed in the aforespecified insulating layer of which the layer 17 constitutes a portion. Such plural windows or vias are designed to be made at each test site such as the site 12 depicted in detail in FIG. 2. More specifically, as shown in FIG. 2, nine windows 32 through 40 are designed to extend through the aforenoted insulating layer and to provide access to various spaced-apart portions of the underlying conductive member 20. Subsequently, at a level on top of the insulating layer, a conductive layer made, for example, of a metal such as aluminum is deposited and patterned. Portions of this patterned conductive layer extend into the windows 32 through 40 and establish contacts with the conductive member 20. Other portions of this conductive layer are patterned to form contact pads 44 through 52 distributed around the perimeter of the test site 12 (FIG. 2) and, in addition, to form connections between the pads and the portions that extend into the windows 32 through 40. In that way, electrical connections can be made between external test equipment and the aforementioned nine specified portions of the conductive member 20.

In one specific illustrative test structure made in accordance with the principles of the present invention, the conductive member 20 of FIG. 2 is characterized by a sheet resistance of 30 ohms per square and a width W of 10 μm. Further, the length L of each of the ten legs of the member 20 is approximately 60 μm. Each of the contact window openings 32 through 40 is assumed to measure about 3 μm by 3 μm. In one such particular embodiment, the resistance of the member 20 between input pad 45 and output pad 48 is about 1,800 ohms. By applying a test voltage of approximately 10 volts between the pads 45 and 48, a test current of about 5.5 milliamperes is caused to flow therebetween. In turn, voltages measured between selected pairs of pads on the site 12 provide an indication of the alignment of the contact windows depicted in FIG. 2.

When the indicated windows are properly aligned with respect to the conductive member 20 of FIG. 2, the distance through the member 20 between the windows 33 and 34 is designed to be equal to the distance through the member 20 between the windows 34 and 35. Accordingly, the voltage $V_{44-46}$ appearing between the pads 44 and 46 in response to establishing a current flow between the pads 45 and 48 is equal to the voltage $V_{44-52}$ appearing between the pads 44 and 52. Similarly, in the aligned case, the voltage $V_{47-50}$ between the pads 47 and 50 is designed to be equal to the voltage $V_{47-49}$ between the pads 47 and 49.

In FIG. 2, the contact window 36 in leg 23 is spaced apart from the window 35 by a reference distance designated $L_R$. In one specific illustrative embodiment, $L_R$ equals 30 μm. By means of the pads 51 and 52, the voltage drop between the contact windows 35 and 36 can be measured. In that way, a reference or calibration value for the voltage appearing across a prescribed length of the conductive member 20 is ascertained. Of course, other prescribed lengths to which electrical access is made via already existing pads such as the pads 46, 52 or 50, 49 can be utilized for calibration purposes.

For purposes of a specific illustrative example, assume that in the course of processing the wafer 10 of FIG. 1, the alignment of contact windows in both the test site 12 and nearby circuit sites deviates in the x and y directions from prescribed locations. Specifically, assume that each window is displaced from its prescribed location by 0.5 μm ($\Delta L_x$) in the +x direction and by 0.5 μm ($\Delta L_y$) in the +y direction. In FIG. 2, a dashed-line square to the right and above each of the contact windows 32 through 40 indicates the position on the member 20 of each such misaligned window. The misaligned windows displaced from the windows 32 through 40 are designated 32' through 40', respectively.

For the aforespecified misaligned case, it is apparent from FIG. 2 that the path in the conductive member 20 across which $V_{44-46}$ is measured is shorter by $2\Delta L_x$ relative to the aligned case whereas the path across which $V_{44-52}$ is measured is longer by $2\Delta L_x$. Hence, the voltage difference between $V_{44-46}$ and $V_{44-52}$ arising from an x-direction misalignment is twice as great as in test structures as heretofore proposed. This voltage difference is, of course, representative of the amount of misalignment. For an x-direction misalignment of 0.5 μm, the voltage difference between $V_{44-46}$ and $V_{44-52}$ would in practice by approximately 30 millivolts more than in the aligned case.

Similarly, in the noted misaligned case, the path across which $V_{47-50}$ is measured is shorter by $2\Delta L_y$ relative to the aligned case and the path across which $V_{47-49}$ is measured is longer by $2\Delta L_y$. Thus, a relatively sensitive indication of y-direction misalignment is also provided by the depicted test structure.

In an actual integrated circuit fabrication sequence, the aforespecified electrical measurements constitute an accurate and sensitive indicator of contact window misalignment. By monitoring these measurements and correspondingly adjusting the process parameters if necessary, it is feasible in practice to easily and reliably maintain the fabrication sequence within prescribed limits.

In accordance with the principles of the present invention, S-shaped conductive members of the type specified herein are formed at other subsequent mask levels to test alignment between other mask levels. Illustratively, this is done in the particular manner shown in FIG. 3. There, an insulating layer 60 made, for example, of silicon dioxide covers the conductive portion 18 that extends to the contact pad 47 (FIG. 2). Formed on top of the layer 60 are two additional conductive S-shaped members disposed at 90 degrees with respect to each other. A cross-section of one leg 62 thereof is shown in FIG. 3. By way of example, the S-shaped members including the leg 62 are assumed to be made of doped polysilicon exhibiting a sheet resistance of approximately 20 ohms per square. Otherwise, illustratively, these additional S-shaped members are identical to the ones shown in FIG. 2.

An insulating layer 64 is formed over the conductive S-shaped members including the leg 62 shown in FIG. 3. Thereafter, contact windows are opened in the layer 64 and a patterned conductive layer 66 is deposited on the layer 64 and in the contact windows, in the same manner described earlier above. In that way, the alignment achieved between the mask level at which the contact windows are defined and the level at which the S-shaped members including the leg 62 are defined can be electrically measured.

Finally, it is to be understood that the above-described techniques and test structures are only illustrative of the principles of the present invention. In accordance with these principles, numerous modifications and alternatives may be devised by those skilled in the art without departing from the spirit and scope of the invention.

I claim:

1. A method of making an integrated circuit comprising the steps of:

fabricating at least one integrated circuit at one or more respective chip sites of a semiconductor wafer in accordance with a specified process sequence, said sequence involving forming an insulating layer between patterned upper and lower conductive layers, at least one other site on said wafer being dedicated for alignment test purposes, and forming an insulating layer between upper and lower conductive layers at each test site in the same respective steps in which said layers are formed at each chip site, wherein the improvement comprises forming at each test site at the level of one of said conductive layers two S-shaped conductive test members disposed at 90 degrees with respect to each other.

2. A method as in claim 1 wherein the improvement further comprises forming at each test site a plurality of windows in the insulating layer to permit electrical contact to said S-shaped conductive test members, said windows being formed in the same step in which windows are formed at said circuit chip sites, and detecting misalignments of the windows by determining the distances along the S-shaped conductive test members between successive windows.

3. A method as in claim 2 wherein the improvement further comprises determining said distances by establishing a current flow through the entire serial extent of each of said S-shaped conductive members at each test site and measuring the voltage drops along said members between successive windows.

4. A method as in claim 3 wherein the improvement further comprises forming the S-shaped conductive test members at each test site in the same step in which the lower conductive layer is formed at said circuit chip sites, and adjusting the process sequence for subsequent wafer fabrication as indicated by said measured voltages.

* * * * *